United States Patent
Yamazaki

[11] Patent Number: 5,179,073
[45] Date of Patent: Jan. 12, 1993

[54] METHOD OF SHAPING SUPERCONDUCTING OXIDE MATERIAL

[75] Inventor: Shunpei Yamazaki, Tokyo, Japan

[73] Assignee: Semiconductor Energy Laboratory Co., Ltd., Kanagawa, Japan

[21] Appl. No.: 780,788

[22] Filed: Oct. 23, 1991

Related U.S. Application Data

[63] Continuation of Ser. No. 564,681, Aug. 7, 1990, abandoned, which is a continuation of Ser. No. 252,591, Oct. 3, 1988, abandoned.

[30] Foreign Application Priority Data

Oct. 7, 1987 [JP] Japan ............... 62-253177

[51] Int. Cl.⁵ ............................................. H01B 12/00
[52] U.S. Cl. ............................ 505/1; 156/600; 156/603; 156/DIG. 73; 505/729; 505/730
[58] Field of Search ....... 156/600, 603, 613, DIG. 73; 505/1, 729, 730; 204/192.24

[56] References Cited

U.S. PATENT DOCUMENTS

| | | | |
|---|---|---|---|
| 4,401,054 | 8/1983 | Matsuo et al. | 427/47 |
| 4,808,553 | 2/1989 | Yamazaki | 427/39 |
| 4,808,554 | 2/1989 | Yamazaki | 427/39 |
| 4,816,113 | 3/1989 | Yamazaki | 427/38 |
| 4,963,524 | 10/1990 | Yamazaki | 505/1 |
| 4,975,411 | 12/1990 | Dandy et al. | 505/1 |

OTHER PUBLICATIONS

Arendt et al, "Aligned Sintered Compacts of $RBa_2Cu_3O_7$" High Temperature Superconductors, M.R.S. vol. 99 pp. 203-208 Nov. 30, 1987.
Ekin, "Transport Critical Current in Bulk Sintered YBaCuO and Possibilities For Its Enhancement," Adv. Ceramic Mats. vol. 2, No. 3B Spe. Iss. 1987 pp. 586-592.
Transcon et al, "Superconducting Oxide Synthesis" Chemistry of High Temperature Superconductors, Nelson, edit. ACS Symp. Series 351 Sep. 1987 pp. 207-210.

Primary Examiner—Robert Kunemund
Attorney, Agent, or Firm—Sixbey, Friedman, Leedom & Ferguson

[57] ABSTRACT

A method of forming a superconducting oxide material comprises the steps of forming of a superconducting oxide material into a thin film on a film-forming surface portion, creating a plasma to form an activated oxygen atmosphere, subjecting the thin film to a magnetic field through the thickness of the thin film, thereby injecting the activated oxygen into the thin film so that crystals of the superconducting oxide material are aligned parallel or perpendicular to the film-forming surface portion.

7 Claims, 2 Drawing Sheets $(IIIa\ IIa2)\ Cu_3O_{7-x}$

METHOD OF SHAPING SUPERCONDUCTING OXIDE MATERIAL

This is a continuation application of Ser. No. 07/564,681 filed Aug. 7, 1990, now abandoned, which is a continuation application of Ser. No. 07/252,591 filed Oct. 3, 1988, now abandoned.

BACKGROUND OF THE INVENTION

1. Field of the Invention

The present invention relates to a superconducting oxide material, and specifically a process for manufacturing a superconducting oxide ceramic material film, wherein crystals are uniformly aligned in a direction perpendicular or parallel to a surface portion on which the thin film is formed.

2. Description of the Related Art

Recently, superconducting ceramic materials have been attracting a great deal of attention. These materials were first reported by IBM's Zurich Laboratories in the form of Ba-La-Cu-O (BALACUA) type high temperature superconducting oxide material. In addition, the YBCO ($YBa_2CuO_{6-8}$) types are also known. However, these types could be prepared only by mixing and firing various types of oxide powders to form tablets, so that even when a Tc onset of 90K was obtained, a sufficiently thin film was not possible. In addition, it was completely unknown that the thin film forward at a lower temperature can have crystal grains uniformly oriented in a direction with reference to the surface portion on which the film is formed (which is hereinafter referred to as the film-forming surface portion).

The critical current density of these superconducting materials with polycrystalline oxide structure in tablets is small. In order to correct this problem, it is desired that all the ab surfaces of the crystal grains (also referred to as the C surface, the surface perpendicular to the c axis direction) be mutually oriented.

Furthermore, it is strongly desired that the Tco (temperature at which resistance is zero) of the superconducting oxide material be higher. It is desirable that operation be possible at the temperature of liquid nitrogen (77K) or a higher temperature, and that, in turn, the Tco temperature of 90K or higher be available in the structure of the thin film.

In addition, there is no means of performing oxygen treatment at lower temperature that will reach into the interior without damaging the surface; also, in the case of a porous superconducting material, even if annealing is possible there has not been any means of performing, in a short time, oxide annealing of single crystals or a closely similar material which have been adequately oriented.

SUMMARY OF THE INVENTION

One object of the present invention is to provide a method of producing a superconducting oxide material with which a device utilizing crystal anisotropy is easily produced.

Another object of the present invention is to provide a method of producing a superconducting oxide material having a large critical current density.

These objects are accomplished in the present invention by the provision of a process of converting an oxidizing gas to plasma, applying a magnetic field to the film-forming surface portion, and subjecting the film to magnetism, heat and plasma annealing, thereby causing crystal realigning.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

In order to improve the superconducting characteristics of an oxide superconducting material, particularly in a thin film, an oxidizing gas is converted to plasma, for example by microwaves in the present embodiments; at the same time a magnetic field is applied to the film-forming surface portion. The combination of magnetism, heat and plasma annealing causes the crystal to realign during annealing.

Specifically, a method of forming a superconducting oxide material in the present embodiments comprises the steps of forming of a superconducting oxide material into a thin film on a film-forming surface portion, creating a plasma to form an activated oxygen atmosphere, subjecting the thin film to a magnetic field through the thickness of the thin film, thereby injecting the activated oxygen into the thin film so that crystals of the superconducting oxide material are aligned in a predetermined direction with reference to the film-forming surface portion.

More specifically, in order to achieve higher critical current density in this invention, activated oxygen such as O or $O_3$, which is produced at very high efficiency in a microwave plasma, is used as an annealing gas in the magnetic field plasma annealing for thin film forming. This activated gas is injected into the interior through a magnetic field. That is, since the magnetic field penetrates into the interior of the superconducting material, as long as this activated plasma remains activated it penetrates into the interior along magnetic field lines. For this reason, whereas in the previously well-known simple plasma annealing method, after the activated oxygen arrives at the surface of the material, it penetrates into the interior only by thermal diffusion, in the method of this invention, annealing takes place by the 10 times faster injection speed in bulk (in the interior). In addition, to prevent the surface being treated from being sputtered (damaged) which would cause the characteristics of the oxide superconducting material to deteriorate, when this annealing method is used, neither sputtering nor either low frequency (1 KHz to 15 MHz) or high frequency (for example 13.56 MHz) plasma CVD is carried out; the frequency is increased into the microwaves region (500 MHz to 10 GHz, typically 2.45 GHz), so that when the plasma is produced, kinetic energy is not imparted to either the reactive gas or the particles.

Figure 1:
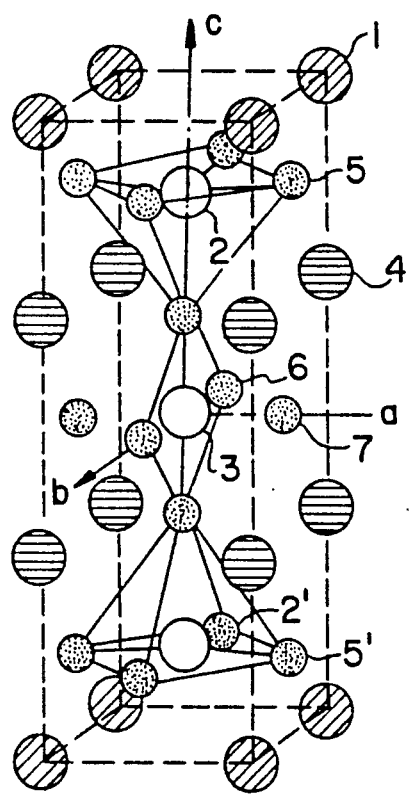
FIG. 1 is a diagram showing one example of the crystal structure of the superconducting oxide material used in the present invention.
Figure 1:
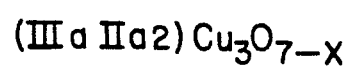

It is possible to produce a material consisting of superconducting oxide materials by other methods, such as sputtering, spraying, CVD and printing. Sometimes in these methods; amorphous structures can be observed at an initial stage. In order to produce such a material, the a, b or c axis of crystals having a deformed perovskeit structure as shown in FIG. 1 is aligned parallel or approximately parallel to a desirable direction corresponding to its use, and the magnetic field used to produce the plasma is used at the same time. It is possible with this magnetic field to realign the crystal array plane in a fixed direction to produce magnetic axial growth. In addition, in the case in which a single crystal is grown, magnetic epitaxial growth occurs. This invention takes thin film materials and tablet materials produced by the previous methods and applies a magnetic field continuously to anneal the material, producing a realignment in the direction of the magnetic field. A magnetic field of 0.1 Tesla (T) or more which penetrates the material is used to cause annealing to take place while the magnetic field is applied continuously in the desired direction, in a highly dense plasma produced in activated oxygen or a gas containing activated oxygen. This permits the film orientation to be aligned in a direction where the magnetic field and the c axis are aligned.

A representative superconducting oxide material used in the present invention is an oxide using elements in Group IIa and Group IIIa of the Periodic Table and copper.

The superconducting material of the present invention can be generally represented by the expression $(A_{1-x} B_x)_y Cu_zO_w$, where $x=0.1$ to 1, $y=2.0$ to 4.0, preferably 2.5 to 3.5, $z=1.0$ to 4.0, preferably 1.5 to 3.5, and $w=4.0$ to 10.0, preferably 6 to 8. One representative example is a material having a modified or deformed perovskeit structure represented by the expression $AB_2Cu_3O_{6-8}$. A is at least one member selected from the yttrium group and the other lanthanoids. The yttrium group is defined as the group containing Y (yttrium), Gd (gadolinium), Yb (ytterbium), Eu (europium), Tb (terbium), Dy (dysprosium), Ho (holmium), Er (erbium), Tm (thulium), Lu (lutetium), Sc (scandium), and other lanthanoids - Physics and Chemistry Dictionary (Iwanami Shoten, published Apr. 1, 1963).

B is at least one member selected from the group of Ba (barium), Sr (strontium) and Ca (calcium).

The superconducting oxide material illustrated in the present invention has the crystal structure as shown in FIG. 1, which is a modified or deformed perovskeit structure. It has a plane including copper (2) and its neighboring oxygen (5), and other planes including copper (3), oxygen (6) positioned next to it, and oxygen vacancy (7), and including copper (2') and oxygen (5'). It has an element (1) from Group IIIa of the Periodic Table, for example Y, and an element (4) from Group IIa of the Periodic table, for example, Ba.

The inventor of the present invention, suggests as the mechanism which creates superconductivity, that by means of the mutual action of oxygen (5), (5') having a layer structure, and copper (2), (2') which is at the center of the layer, electrons which are paired (electron pair) shift the surface (the surface formed at the ab axes, specifically the surface parallel to the C surface). Up to this time, mutual action with a phonon was considered to be the cause of the formation of the paired electrons, based on the BCS theory.

However, the inventor of the present invention hypothesizes a theory that a quasiparticle known as a magnon is created when upper and lower oxygen vacancies (7) between which this laminar structure is sandwiched (the other vacancy exists in the atomic system which is positioned on the upper or lower side of the diagram) are associated with each other or with a rare earth element (1) which is a screw magnetic body, and that the quasiparticle acts as an intermediary to form a pair of electrons spinning in opposite directions. Specifically, the magnon fluctuates in the c axis direction in the drawing (the fluctuation of the magnon in the direction perpendicular to the ab surface is best reflected in the electron pair), and this magnon, which draws one of the electrons in pair having spinning in mutually opposite directions, is repelled by the other. The magnon not completely in evidence but works behind the scenes, and the electron pairs shift in the direction parallel to their respective a - b axes in a surface with a laminar structure (surface made from (2), (5) and surface made from (2'), (5')). This can be considered as the cause of superconductance. In addition, it is possible to consider that the fluctuation of the oxygen vacancy is the fluctuation of the phonon, and therefore to have a pattern which supplements the BCS theory, in which it can be considered that the phonon, through the medium of the magnon, indirectly causes the electron pair to form.

Since the magnetic field has a strong effect on the action described here, it can be expected that when the magnetic field is applied in annealing, it will affect the crystal orientation. This annealing is done in an atmosphere in which a plasma has been created by the mutual interaction of the magnetic field and electric field; in addition, the magnetic field used to produce the plasma is applied to the material being annealed. The film-forming surface portion is aligned either parallel or perpendicular to the magnetic field in the region where the magnetic field is strong to align all of the crystals in a specified direction during annealing.

In addition, by also applying a microwave electric field in a direction perpendicular to this magnetic field, that is to say in the ab plane in which the electric current flows when the material is superconducting, this alignment is made easier. In particular, by applying the electric and magnetic fields in such a way that they mutually interact, mixed cyclotron resonance occurs making it possible for the plasma to be produced not at the low pressures of $10^{-3}$ to 0.1 torr familiar in the plasma CVD method and the ECR (electron cyclotron resonance) method, but at a very high pressure of 1 to 800 torr, at which a high density plasma is produced. By more completely reacting the reactive gas or reactive particles with the activated oxygen, the reaction products are oriented, so that the c axis is aligned with the magnetic field. For this reason, the reaction products gradually accumulate on the film-forming surface portion with the c axes of the reaction products oriented along the magnetic field. In consequence it becomes possible to create films with less restriction on the type of substrate. Another desirable feature of this method is that by applying a magnetic field while the material is being heated, a polycrystalline film can be grown such that the polycrystal axes are aligned or approximately aligned with each other. By using a substrate that has crystal directions with its orientation axis aligned with the growth plane, magnetic epitaxial alignment is done at low temperature, wherein the thin film is formed with single crystal alignment.

In this case, the superconducting oxide material having a single crystal structure is obtained at a lower temperature. The critical current densities along the C plane in FIG. 1 are larger than those normal to the C plane by two or much orders of magnitude. For this reason, when using polycrystals, it is extremely important that polycrystals having scattered crystal orientations be arranged to have the crystal axis positioned in one direction in order to obtain a high critical current density.

In this invention, when the film formed is subjected to a magnetic field and heat annealing by applying a magnetic field of 0.1 Tesla (T) or more, typically 0.3 T to 5 T, in the intended c-axis direction, most or all of the crystals, that is to say polycrystals are grown, having their c-axes aligned in the direction in which realignment is to take place, which is the same as or close to the magnetic field direction. In addition, by applying a microwave electric field in a direction perpendicular to this magnetic field, in the ab plane, it is made even easier to align the crystal c axes with the magnetic field.

In this way one crystal particle developing into a polycrystal in an initial amorphous structure can become larger even if it is composed of fine particles each having a grain size of 10 to 1000 Å. In turn, because adjacent crystals have substantially the same crystal axis in common, the barrier and the blow hole at the crystal boundary have more of a tendency to disappear, and a structure equivalent to the single crystal can be obtained. Then, the respective crystals can all become adjusted at the ab surface (the surface perpendicular to the c axis). As a result, by the method of the present invention, the critical current density, which up to the present has been $10^2$ A/cm$^2$ (77K) in the case of random crystal orientation, increases up to $10^4$ to $10^6$ A/cm$^2$ (measured at 77K) with the current flowing parallel to the ab surface, and can become equal in density to a single crystal or at least close to about the 1/5 level. Then, it becomes easier to make a thin film of the single crystal structure of large area, which is ideal for a superconducting oxide material.

In this invention, a magnetic field has been applied in the vertical direction or horizontal direction with respect to a superconducting film having a certain axis alignment; additionally applying a microwave electric field perpendicular to the magnetic field to generate activated oxygen is effective in lowering the annealing temperature.

In addition, the crystal axis of the substrate which has the film-forming surface portion is effectively adjusted by the magnetic field, conforming to the direction of arrangement of the crystals. For example, the crystal substrate (100) of MgO (magnesium oxide), SrTiO$_3$ (strontium titanium oxide), and YSZ (yttrium stabilized zircon) can be used, and a magnetic field applied in the direction perpendicular to the film-forming surface portion to create a film, so that the ab surface can be formed parallel to the film-forming surface portion. In addition, using these crystal substrates which have a (110) surface, when a magnetic field is applied parallel to the film-forming surface portion for film-forming and annealing, it is possible to obtain the ab surface formed in the direction perpendicular to the film-forming surface portion during heat and magnetic field annealing. Then it is possible to obtain a thin film of a single crystal or of polycrystals close to the single crystal.

EMBODIMENT NO. 1

Figure 2:
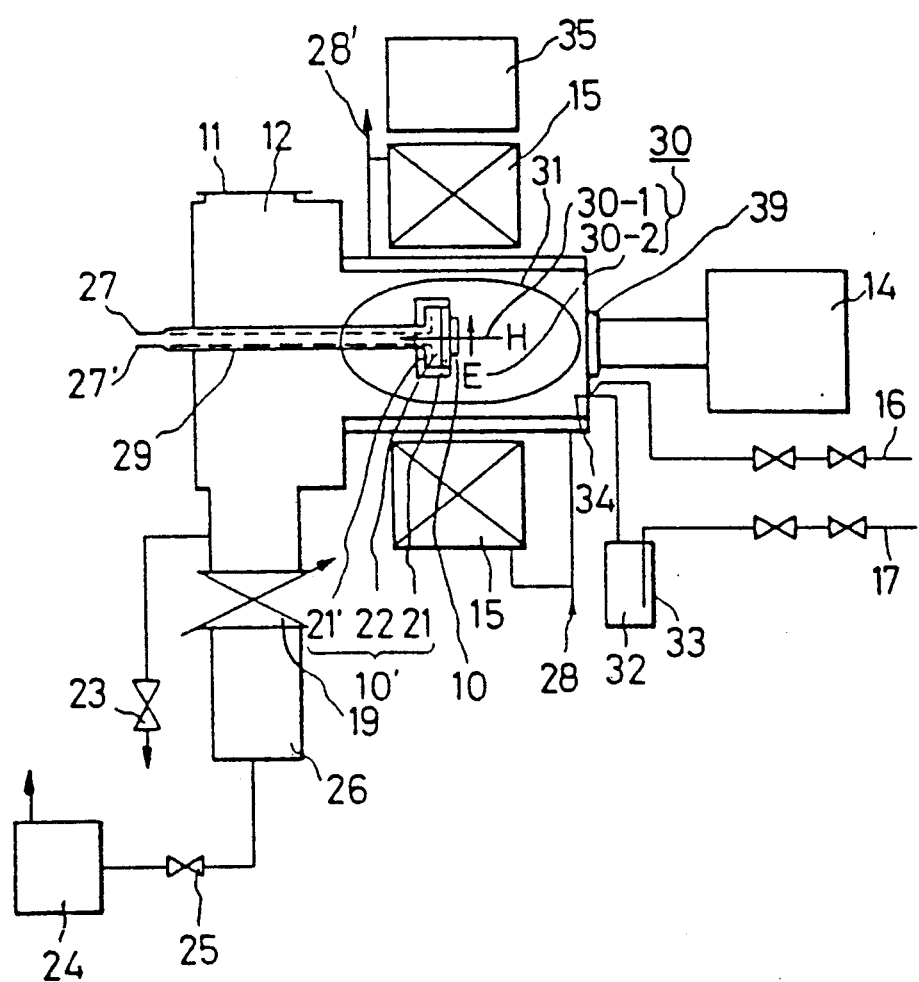
FIG. 2 is a diagram showing a microwave plasma annealing device with magnetic field applied used in this invention.

Now referring to FIG. 2, this drawing shows the magnetic field assisted microwave plasma annealing device used in the present invention to carry out the formation of the superconducting oxide material and the magnetic field and heat annealing after the formation.

The device in this drawing comprises a plasma generating chamber 31 which can be maintained at atmospheric pressure or at a reduced pressure, an auxiliary space 12, a cylindrical electromagnet 15 which generates a magnetic field, a power source 35 for the electromagnet 15, a microwave oscillator 14, a vacuum pump 26 and a rotary pump 24 for an exhaust gas system, a pressure adjusting valve 19, a substrate holder 10', a substrate 10 having a film-forming surface portion, a microwave introduction window 39, a plurality of gas systems 16, 17, a plurality of water cooling systems 28, 28', a rod 29 for removing the substrate and substrate holder, an da plurality of water cooling systems 27, 27' for cooling and maintaining a film-forming surface portion at a suitable temperature through the inside of the rod.

The substrate holder 10' is provided with a buffer layer 21, 21' and a cooling layer 22 to convert the substrate surface which has overheated from the plasma in the plasma generating chamber 31 to a suitable temperature, and to maintain the substrate surface at a specified temperature, for example, 200° to 500° C. The cooling layer 22 is formed from iron, nickel, or cobalt, all of which are ferromagnetic materials, and one part is hollow to allow circulation of the cooling water in the system 27, 27'. The buffer layer 21, 21' is formed of a non-magnetic, heat resistant material such as ceramic, stainless steel, or glass. The cooling layer 22 of the ferromagnetic member strengthens the magnetic field at the surface of the substrate, and in order to avoid having it reduced to paramagnetism from overheating, it is shielded from heat by the buffer layer 21, 21'.

First, the substrate 10 having a superconducting oxide material is set on the substrate holder 10', and this system is positioned in the plasma generating chamber 31 through a gate valve 11. In this embodiment of the present invention, the MgO, SrTiO3 or YSZ type with a (100) or (110) surface is used as a substrate, and silicon wafer, a glass substrate, platinum substrate or other ceramics which has an insulating film formed for IC on a portion of its top surface, and a superconducting oxide material of YBa$_2$Cu$_3$O$_w$ (w=6 to 10) disposed on a metal such as silver are also used as a substrate.

When operating at atmospheric pressure, the valve 19 is closed and the valve 23 opened. In addition, when operating under reduced pressure, the valves 19 and 25 are opened and the valve 23 is closed, and the vacuum pump 26 and the rotary pump 24 may be operated.

In the manufacturing process, a vacuum of $1 \times 10^{-4}$ or less is first applied to the entire system using the mechanical booster (vacuum) pump 26 and the rotary pump 24. Next, a non-product gas (this is an oxidizing gas which does not itself form a solid body after a decomposition reaction), N$_2$O, NO, NO$_2$, air or oxygen, for example, the oxygen (6) is passed through the 2000 SCCM gas system 16 and introduced into the plasma generating chamber 31 where it is pressurized to 30 torr. An external microwave of 500 MHz or greater, for example a microwave 30-2 of a frequency of 2.45 GHz, is applied form the microwave oscillator 14 at a strength of 0.5 to 5 KW, for example, 1.5 KW. In addition, by using a magnet 15 water-cooled as shown by 18, 18', magnetic field 30-1 is applied, wherein an electric current flows through the magnet 15 to obtain a magnetic field of about 1 T at the surface of the substrate 10, and a high density plasma with mixed cyclotron resonance is generated in the plasma generating chamber 31. At this time a magnetic field 30-1 and an electric field 30-2 are mutually at right angles. In the drawing, the magnetic field 30-1 is applied perpendicular to the film-forming surface portion. By means of this high density plasma, activated oxygen at almost 100% ionization can be created. Superconducting oxide materials e.g. those conforming to $(A_{1-x}B_x)Cu_zO_w$, is formed on the substrate 10 by a sputtering method, electron beam evaporation, spray method, or screen printing method in this embodiment.

When mixed cyclotron resonance is obtained by mutual utilization of microwave energy and a magnetic field, the plasma temperature is much higher than 1150° C. (the melting temperature of the superconducting oxide material), being as high as the 3000° to 10,000° C. range, whereupon the reactive atoms are formed on the film-forming surface portion in the inherent crystal structure. A thin film of this superconducting oxide material can be accumulated on the film-forming surface portion of the substrate 10 on the substrate holder 10' which is cooled to a low temperature by the cooling layer 22 so that the temperature of the substrate itself is in the low range of 200° to 500° C.

Then, by annealing at 400° C. for about three hours in the magnetic field after the film is formed, it is possible to form a thin film superconducting oxide material by virtue of modification thereof with a modified perovskeit structure of rhombic crystals with a thickness of 1 $\mu m$ to 1 mm as indicated in FIG. 1, wherein twins are rarely observed in the modified or deformed film. There is a twin phase boundary observed every 200 to 1000 Å in the conventional thin film not in the modified or deformed structure.

In FIG. 2, one ring-shaped magnet 15 is used for generating the magnetic field 30-1.

In the plasma generating chamber 31 there is also a region (within 875 gauss ± 185 gauss) which has mutual action between an electric field and a magnetic field, and there are many other regions which have an even greater magnetic strength.

Then, the substrate 10 is positioned in the region which has the maximum magnetic field (here, it is the section centered around the magnet 15). Therefore, in the case of the arrangement shown in FIG. 1, the magnetic field 30-1 is applied perpendicular to the film-forming surface portion on the substrate, and the electrical field 30-2 is applied parallel to that surface. The strength of the magnet is controlled in order to create a region of 875 gauss which satisfies mixed cyclotron resonance in the space between the film forming surface in the plasma generating chamber 31 and the nozzle 34 for introducing the gas.

The material for producing the oxide superconducting film is formed into a film on the film-forming surface portion of the substrate in the direction of the magnetic field along the c axis through the activated dissociation reaction in the area of mixed cyclotron resonance.

The critical current density of the superconducting oxide film made at this time was measured at $11.2 \times 10^5$ $A/cm^2$ parallel to the substrate surface.

Specifically, the crystal structure shown in FIG. 1 was sufficiently formed at the time the film was formed and in the subsequent annealing. Also, it was apparent from the results of X-ray analyses that the c axis was formed in the direction parallel to the magnetic field, specifically, in the direction perpendicular to the film-forming surface portion.

EMBODIMENT NO. 2

In general this embodiment uses a substrate of superconducting material in tablets having constituents of the form $YBa_2Cu_3O_{6\text{ to }8}$ or $YBaSrCu_3O_{6\text{ to }8}$. In advance of a magnetic-heat annealing of a substrate containing a superconducting oxide material for 15 hours in a microwave plasma activated oxygen atmosphere at 300° C. to 950° C., the substrate is set in the device shown in FIG. 2, in order that the c-axis is aligned with the magnetic field (30-1) (having a strength of 0.5 to 3 T). A magnetic field of 1 T is applied at 930° C. for 3 hours, followed by gradual cooling at a rate 10° C./minute, then keeping 2 T at 400° C. for 1 hour, then gradual cooling at 10° C./minute until 300° C. is reached, at which point the magnetic field is no longer applied, stopping plasma formation. In addition, an electric field of $10^3$ to $5 \times 10^4$ V/cm (30-2) was applied in a direction perpendicular to the magnetic field. As a result, Tco was increased by about 100K, resulting in 230K to 280K. Also, a critical electric current density of $2.3 \times 10^4$ $A/cm^2$ was obtained.

In this invention, the material to which magnetic field and heat annealing are applied dose not necessarily have to be in a thin film or tableted form. Depending on market needs it can have the form of a film 3 to 30 micrometers thick, a wire of band structure 1 to 5 mm wide and 10 to 1000 micrometers thick or a wire coated with silver around its outer diameter. In any of these cases a magnetic field is applied in the thickness direction to realign the crystals inside the band.

In summary, by the use of the present invention, it has become possible to create a thin film superconducting oxide material with the crystal axes uniformly oriented which operates at the temperature of liquid nitrogen or higher, which up to now has been impossible to attain. It is also possible to make an oriented polycrystal superconducting oxide thin film on the surface of the substrate in an amorphous or microcrystalline structure of glass, silicon oxide, or silicon nitride or the like.

In this invention, a superconducting material that has already been formed into for example a Josephson element having the desired shape is re-heat annealed in an oxide plasma in a magnetic field at 300° C. or higher temperature. At the same time a microwave electric field is applied in the direction in which it is intended for the electric current to flow. A magnetic field is added in the c-axis direction; this is effective in aligning the crystals in one direction.

Superconducting ceramics for use in accordance with the present invention also may be prepared in consistence with the stoichiometric formulae $(A_{1-x}B_x)_yCu_zO_2$, where A is one or more elements of Group IIIa of the Periodic Table, e.g., the rare earth elements, B is one or more elements of Group IIa of the Periodic Table, e.g., the alkaline earth metals including beryllium and magnesium, and x=0 to 1; y=2.0 to 4.0, preferably 2.5 to 3.5; z=1.0 to 4.0, preferably 1.5 to 3.5; and w=4.0 to 10.0, preferably 6.0 to 8.0. Also, superconducting ceramics for use in accordance with the present invention may be prepared consistent with the stoichiometric formulae $(A_{a-x}B_x)_yCu_zO_w$, where A is one or more elements of Group Vb of the Periodic Table such as Bi, Sb and As, B is one or more elements of Group IIa of the Periodic Table, e.g., the alkaline earth metals including beryllium and magnesium, and x=0.3 to 1; y=2.0 to 4.0, preferably 2.5 to 3.5; z=1.0 to 4.0, preferably 1.5 to 3.5; and w=4.0 to 10.0, preferably 6.0 to 8.0.

Examples of this general formula are $BiSrCaCu_2O_x$ and $Bi_4Sr_3Ca_3Cu_4O_x$. Tc onset and Tco samples confirmed consistent with the formula $Bi_4Sr_yCa_3Cu_4O_x$ (Y is around 1.5) were measured to be 40 to 60K, which is not so high. Relatively high critical temperatures were obtained with samples conforming to the stoichiometric formulae $Bi_4Sr_4Ca_2Cu_4O_x$ and $Bi_2Sr_3Ca_2Cu_2O_x$. The number designating the oxygen proportion is 6 to 10, e.g. around 8.1.

What is claimed is:

1. A method for forming an improved superconducting oxide material comprising the steps of placing a superconducting oxide material into a plasma generating chamber, and oxygen annealing the superconducting oxide material by subjecting it to an activated oxygen treatment in which one of oxygen and oxide gas is introduced and activated by converting it to plasma while simultaneously applying a magnetic field to said material to thereby increase the rate of said annealing step.

2. The method of claim 1, wherein the plasma, at a pressure of 1 to 800 torr, produces mixed cyclotron field resonance in which the electric field and magnetic field interact with each other, and said material is positioned in the mixed cyclotron resonance space.

3. The method of claim 1, wherein the superconducting material has the chemical formula $(A_{1-x}B_x)_yCu_zO_w$, where x is 0.1 to 1, y is 2.0 to 4.0, z is 1.0 to 4.0, w is 4.0 to 10.0, A is at least one element selected from the group of Y (yttrium), Gd (gadolinium), Yb (ytterbium), Eu (europium), Tb (terbium), Lu (lutetium), Sc (scandium) and other lanthanoids, and B is at least one element selected from the group of Ba (barium), Sr (strontium) and Ca (calcium).

4. The method of claim 1 where said oxide superconducting material is a copper oxide superconducting material.

5. A method of forming superconducting copper oxide ceramic materials comprising the steps of:
   disposing a superconducting copper oxide based ceramic material in a vacuum chamber;
   introducing a reactive gas comprising oxygen into said vacuum chamber;
   inputting energy to said reactive gas in order to product a plasma of oxygen;
   applying a magnetic field to said superconducting material in the atmosphere of said plasma.

6. The method of claim 5, wherein said applying step is carried out at an elevated temperature.

7. The method of claim 5, wherein the energy applied to the reactive gas is electromagnetic radiation having a frequency of between about 500 MHz to 10 GHz.

* * * * *